US007920975B2

(12) United States Patent
Hull et al.

(10) Patent No.: US 7,920,975 B2
(45) Date of Patent: Apr. 5, 2011

(54) METHODS OF DETECTING ANOMALIES IN AMBIENT ALTERNATING CURRENT FIELDS

(75) Inventors: David M. Hull, Adelphi, MD (US); Stephen J. Vinci, Ellicott City, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 471 days.

(21) Appl. No.: 11/892,152

(22) Filed: Aug. 20, 2007

(65) Prior Publication Data
US 2008/0255779 A1 Oct. 16, 2008

(51) Int. Cl.
*G01R 29/08* (2006.01)
(52) U.S. Cl. ........... 702/57; 702/58; 702/65; 324/117 R; 324/249; 324/207.17; 324/207.18
(58) Field of Classification Search ............ 702/57, 702/58, 65; 324/209, 228, 233, 239, 240, 324/207.17, 326–329, 117 R, 249, 207.18; 701/45–48, 1, 36; 73/862.69; 361/42, 45, 361/93.1, 78
See application file for complete search history.

(56) References Cited

U.S. PATENT DOCUMENTS

| 4,206,451 | A | * | 6/1980 | Kurschner | 340/522 |
|---|---|---|---|---|---|
| 4,405,926 | A | * | 9/1983 | Potter | 342/455 |
| 4,845,434 | A | * | 7/1989 | Kuckes et al. | 324/346 |
| 4,885,546 | A | * | 12/1989 | Araki | 329/341 |
| 5,181,026 | A | * | 1/1993 | Granville | 340/870.28 |
| 5,185,685 | A | * | 2/1993 | Tennies et al. | 361/45 |
| 5,206,596 | A | * | 4/1993 | Beihoff et al. | 324/536 |
| 5,252,912 | A | * | 10/1993 | Merritt et al. | 324/72 |
| 5,376,245 | A | * | 12/1994 | McLeod | 204/155 |
| 5,608,328 | A | * | 3/1997 | Sanderson | 324/529 |
| 6,782,329 | B2 | * | 8/2004 | Scott | 702/58 |
| 6,922,059 | B2 | * | 7/2005 | Zank et al. | 324/457 |
| 7,180,299 | B2 | * | 2/2007 | Mernyk et al. | 324/509 |
| 7,463,987 | B2 | * | 12/2008 | Cech et al. | 702/65 |
| 7,514,917 | B2 | * | 4/2009 | Cech et al. | 324/228 |
| 2002/0077537 | A1 | * | 6/2002 | Avrin et al. | 600/409 |
| 2005/0122118 | A1 | * | 6/2005 | Zank et al. | 324/457 |
| 2006/0009887 | A1 | * | 1/2006 | Rubin et al. | 701/9 |

FOREIGN PATENT DOCUMENTS
JP 04154004 A * 5/1992

OTHER PUBLICATIONS

J.D. Jackson, "Classical Electrodynamics", section 9.1, pp. 407-410, 4th Ed., Wiley, 1999.
H. Trinks and J.L. ter Haseborg, "Electric Field Detection and Ranging of Aircraft," IEEE Transactions on Aerospace and Electric Systems, vol. AES-18, No. 3, pp. 268-274, May 1982.
E.A. Wilson, Electronic Communications Technology, sections 3.1-3.3, pp. 37-46, Prentice-Hall, Englewood Cliffs, NJ, 1989.

* cited by examiner

*Primary Examiner* — Carol S Tsai
(74) *Attorney, Agent, or Firm* — Edward L. Stolarun; Alan I. Kalb

(57) ABSTRACT

Methods of detecting anomalies in ambient alternating current (AC) fields are provided. An exemplary embodiment of such a method includes the steps of placing an AC field sensor in an ambient AC field, generating a signal representative of the ambient AC field received by the sensor, and processing the signal to determine if the ambient AC field includes any anomalies. Various applications for the methods are also provided.

5 Claims, 12 Drawing Sheets

METHODS OF DETECTING ANOMALIES IN AMBIENT ALTERNATING CURRENT FIELDS

GOVERNMENT INTEREST

The invention described herein may be manufactured, used, and licensed by or for the United States Government.

BACKGROUND

1. Technical Field

The invention generally relates to methods of detecting anomalies in ambient alternating current (AC) fields.

2. Description of the Related Art

The prior art teaches various methods of detecting anomalies in ambient direct current (DC) fields. For example, the prior art teaches the use of magnetic field sensors, commonly referred to as magnetic anomaly detectors (MAD), to detect distortions in the earth's DC magnetic field caused by ferromagnetic objects. These types of sensors are typically limited by the dynamic range of the magnetic sensor and/or geomagnetic noise.

The prior art also teaches the use of detecting anomalies in ambient DC fields using electric field sensors. These sensors detect distortions in the earth's DC electric field caused by conducting objects, such as unarmed intruders and/or aircraft that do not include any ferromagnetic components. Unfortunately, alternating current (AC) electric fields generated by 60 Hertz (Hz) AC power lines (typically referred to as 60-Hz power line "hum") interfere with these types of sensors and make it more difficult to detect anomalies in the earth's DC electric field.

SUMMARY

Methods of detecting anomalies in ambient alternating current (AC) fields are provided. An exemplary embodiment of such a method includes the steps of placing an AC field sensor in an ambient AC field, generating a signal representative of the ambient AC field received by the AC field sensor, and processing the signal to determine if the ambient AC field includes any anomalies.

Another exemplary embodiment of such a method comprises: placing an AC electric field sensor in an ambient AC electric field generated by an AC power line; generating a signal representative of the ambient AC electric field received by the AC electric field sensor; and processing the signal to determine if any anomalies are present in the ambient AC electric field.

Another exemplary embodiment of such a method comprises: supplying a stable AC voltage to an AC power line to generate an ambient AC electric field, placing an AC field sensor in the ambient AC field, generating a signal representative of the ambient AC electric field received by the AC electric field sensor, and processing the signal to determine if any anomalies are present in the ambient AC electric field.

Another exemplary embodiment of such a method comprises: supplying a stable AC voltage to an arbitrary conducting surface to generate an ambient AC electric field, placing an AC field sensor in the ambient AC electric field, generating a signal representative of the ambient AC electric field received by the AC electric field sensor, and processing the signal to determine if any anomalies are present in the ambient AC electric field.

Still another exemplary embodiment of such a method comprises: supplying approximately stable AC current to an AC power line that causes the AC power line to generate an ambient AC magnetic field; placing an AC magnetic field sensor in the ambient AC magnetic field generated by the AC power line; generating a signal representative of the ambient AC magnetic field received by the AC magnetic field sensor; and processing the signal to determine if any anomalies are present in the ambient AC magnetic field.

Other methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

Methods for detecting anomalies in ambient alternating current (AC) fields are provided. In an exemplary embodiment, one such method (see FIG. 1) includes the steps of placing an AC field sensor in an ambient AC field (block 10), generating a signal representative of the ambient AC field received by the AC field sensor (block 12), and processing the signal generated by the AC field sensor to determine if the ambient AC field includes any anomalies (block 14).

Figure 1:
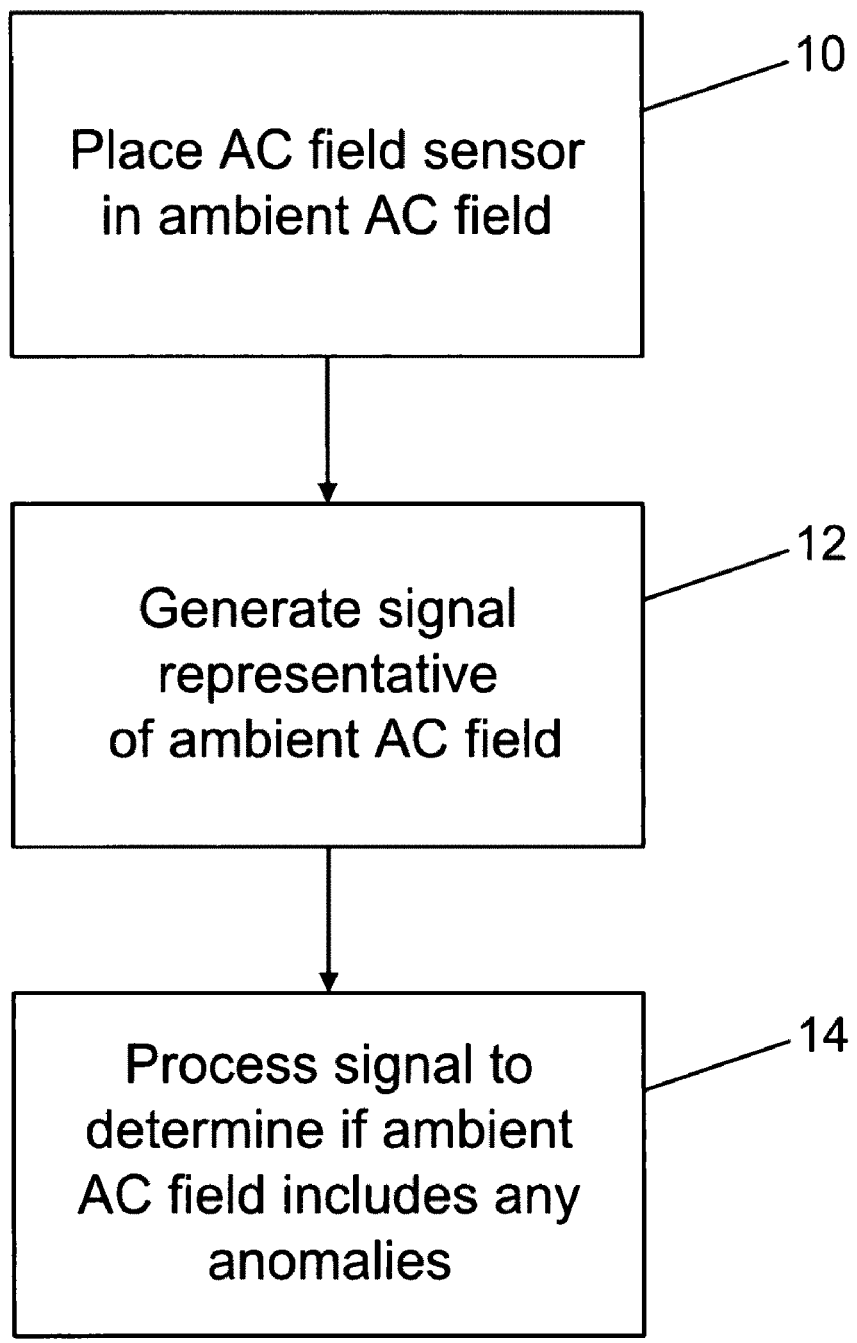
FIG. 1 is a flowchart showing an exemplary embodiment of a method of detecting anomalies in an ambient alternating current (AC) field.

The AC field sensor may be an AC electric field sensor or an AC magnetic field sensor, both of which are well known in the art. For example, AC electric and magnetic field sensors that may be used with the method shown in FIG. 1 are commercially available from Quasar Federal Systems. When the AC field sensor is used with an AC power line, it does not have to be connected to or draw any electric power from the power line. Instead, it simply monitors the ambient AC field that exists whenever the power line is energized.

Figure 13:
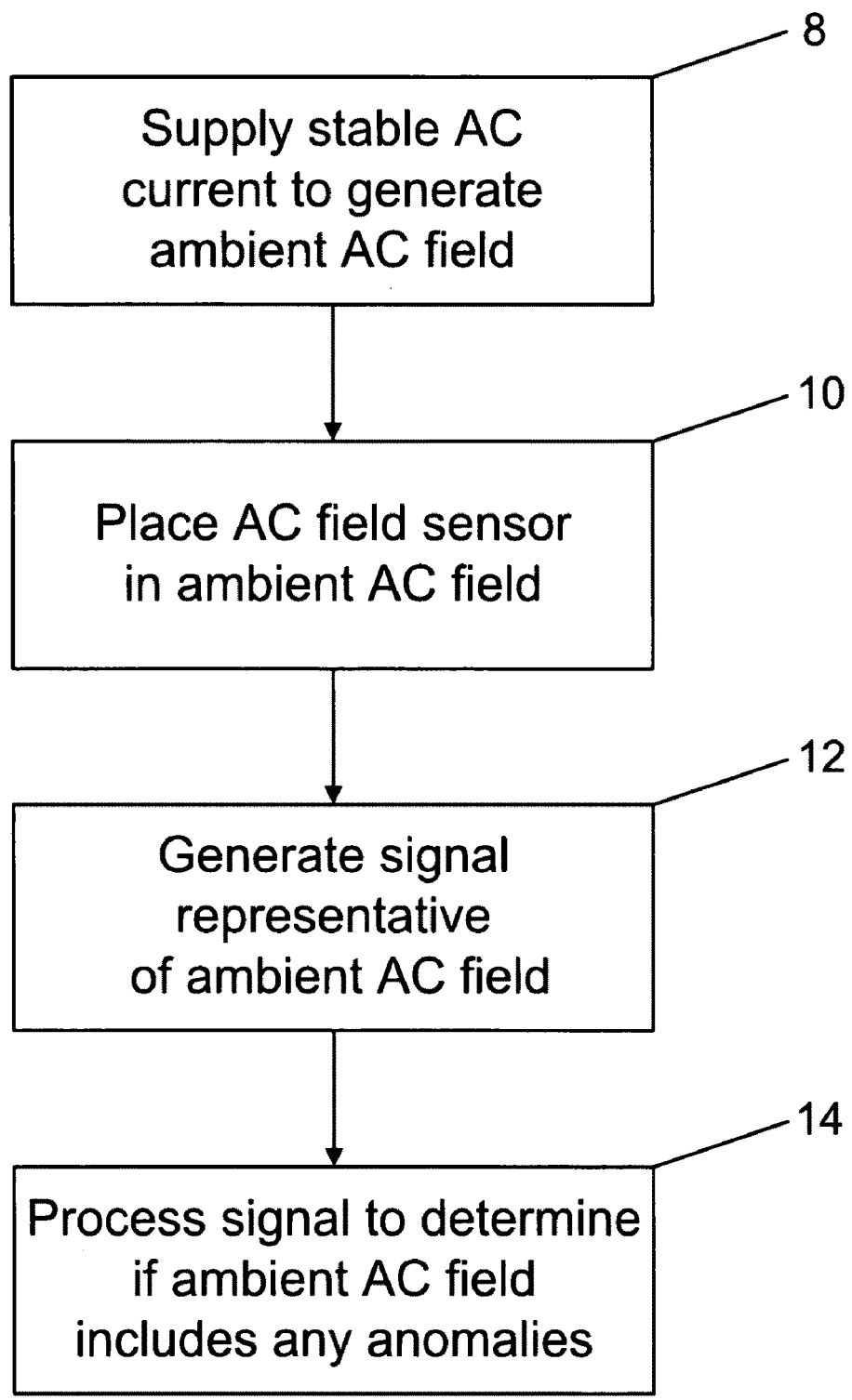
FIG. 13 is flowchart showing an exemplary embodiment of a method of detecting anomalies in an ambient alternating current (AC) field.
Figure 14:
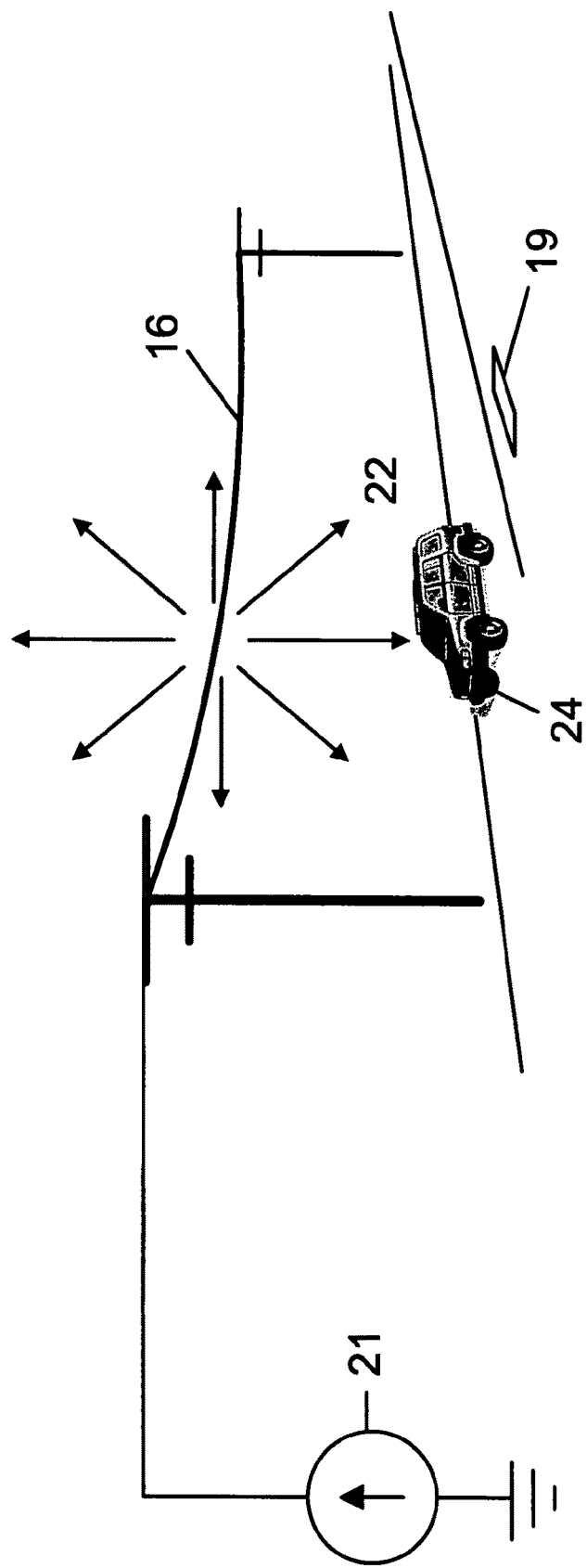
FIG. 14 is a schematic diagram showing an implementation of the method from FIG. 13 using an ambient AC magnetic field generated by an AC power line and an AC magnetic field sensor.

If the ambient AC field is generated by an AC power line (as discussed in more detail below) and an AC magnetic field sensor is used rather than an AC electric field sensor, the method may include the step of supplying a stable AC current (see FIG. 13, block 8) using a current source 21 (see FIG. 14) in order to generate a stable AC magnetic field that can be used for anomaly detection. The frequency of the AC current supplied in this manner may or may not be different from the frequency of the AC power line. Changes in this magnetic field (i.e., anomalies) caused by the presence and/or movement of ferromagnetic objects in this field may be detected using AC magnetic field sensors and the method shown in FIG. 1.

This step is used in this application because the current in an AC power line, and, as a result, the ambient AC magnetic field generated by an AC power line, changes significantly when equipment is turned on and off. The ambient AC electric field generated by an AC power line, in contrast to the ambient AC magnetic field, is related to the voltage on the power line and is stable over time. This is true because AC power lines are supplied with a highly regulated voltage that does not change significantly when equipment is turned on and off.

The ambient AC field may be any reasonably stable quasi-static AC electric or magnetic field, including the ambient AC electric field generated by a 60 Hertz (Hz) AC power line when it is energized and regardless of whether or not the power line is supplying power (i.e. current) to a load. Other sources of ambient AC fields may be used as well, including sources that operate at frequencies other than 60 Hz. For example, the stable AC electric field corresponding to the regulated voltage on the power lines can be the ambient field. The AC magnetic field corresponding to the current in the lines can also be the ambient field, but this magnetic field is not as stable as the electric field because it changes as the power delivered by the lines changes.

As another example, an AC voltage can be applied to the power lines (or to any arbitrary conductor for that matter) to generate a stable electric field at an arbitrary frequency. As another example, an AC current can be applied to the power lines to generate a stable magnetic field at an arbitrary frequency.

The signal generated by the AC field sensor may be a voltage signal (as described in more detail below) or any other type of signal known in the art that can be properly processed to detect anomalies.

Such methods may be used in a variety of different applications, including urban and other environments where ambient AC fields are present. For example, some embodiments may be used in surveillance operations to detect anomalies caused by the presence and/or movement of conducting or quasi-conducting objects, such as armed or unarmed personnel, vehicles, and low-flying aircraft, in ambient AC fields. When used in this manner and in connection with ambient AC fields generated by AC power lines, signal processing techniques to reduce the "clutter" and resulting "false positives" that might be caused by voltage fluctuations on the AC power lines can be used.

In transmission and distribution line monitoring applications, voltage fluctuations on AC power lines can be detected, including unusual voltage fluctuations that typically occur prior to blackouts that sometimes occur.

Unusual voltage fluctuations caused by the movement of AC power lines also can be detected in some embodiments, including dangerous sag due to heating caused by high electrical loads and/or high ambient temperatures. Unusual voltage fluctuations due to sag typically occur on a very long timescale (minutes or hours). Unusual voltage fluctuations caused by AC power lines moving in response to blowing wind occur on a relatively short timescale (seconds) that would be based on the resonant frequency of the AC power lines, which, in turn, is a function of the weight, tension and span length of the lines.

Proximity of trees to AC power lines caused by sagging lines, blowing branches, or growing trees also can be detected in some embodiments, which would allow a power distribution company to know when to cut trees in the power line right-of-way. In this type of application, physical mounting of the AC field sensor to a high voltage conductor could be employed.

Additionally or alternatively, some embodiments can be used to detect the proximity of a truck boom to an AC power line. This type of application would be useful in ensuring that an operator stays a safe distance away from an energized power line.

In the last two applications discussed above, anomalies generated by operators and power line voltage fluctuations would be signal "clutter" and should be distinguished from anomalies caused by the proximity of the trees to the power line and the proximity of the truck boom to the power line. This could be accomplished by using two different ambient AC field sources operating at two different frequencies as explained in U.S. Pat. No. 4,206,451, which is hereby incorporated by reference.

Figure 2:
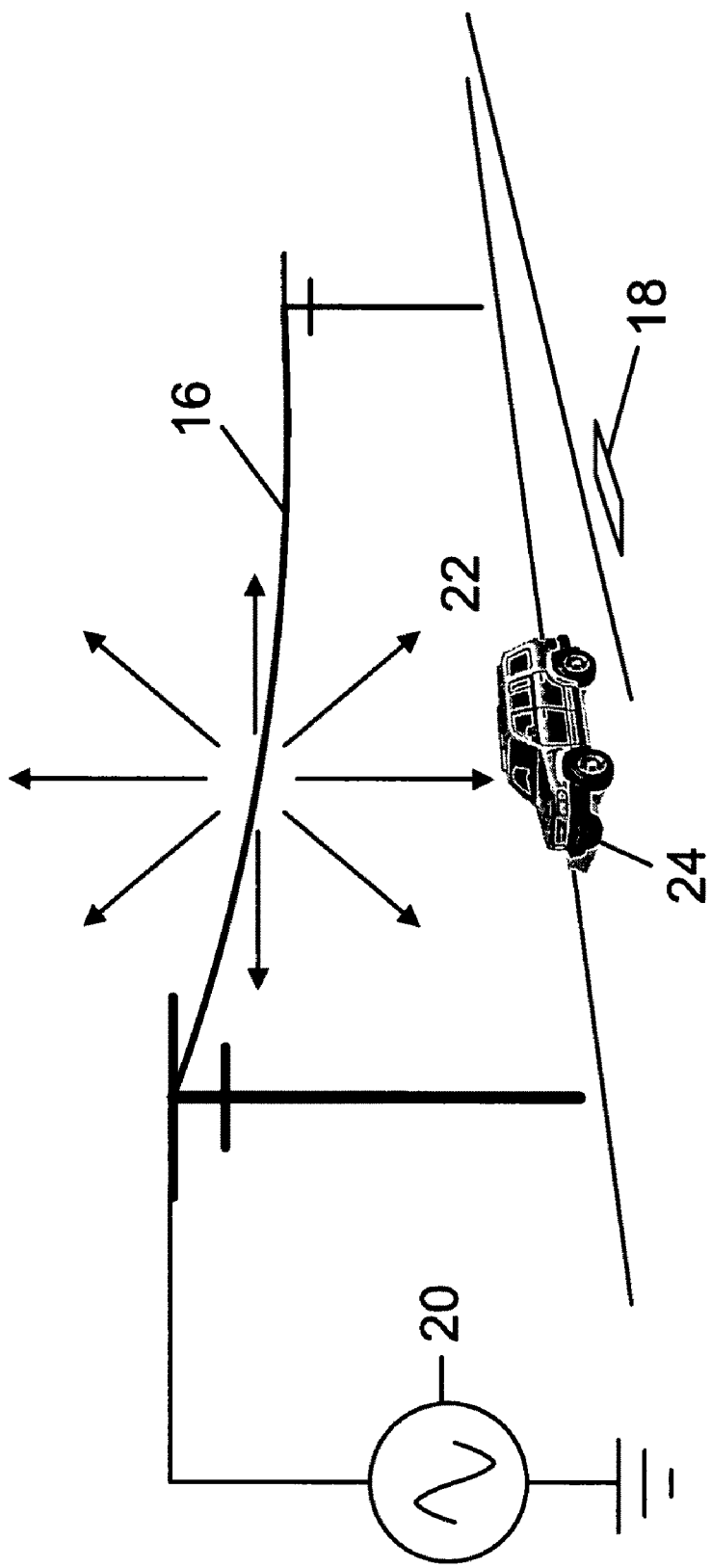
FIG. 2 is a schematic diagram showing an implementation of the method from FIG. 1 using an ambient AC electric field generated by an AC power line and an AC electric field sensor.

FIG. 2 shows an exemplary setup for using the method with a 60 Hz AC power line 16 and an AC electric field sensor 18. As shown in the figure, AC power line 16 is driven by a highly-regulated AC voltage source 20 and generates a measurable quasi-static ambient electric field 22. When an object, such as vehicle 24 or a person (not shown) moves through electric field 22, the object creates a detectable electric field anomaly that can be detected by electric field sensor 18. Sensor 18 may be a low-cost, low-power, passive sensor and can detect objects at a distance ranging from meters to tens of meters. The detection range for sensor 18 is a complex function of field strength (which increases with increasing line voltage, decreases with increasing line-to-target distance, and varies with the geometry of the local environment), the size of the object, and the relative geometry of the power lines, target, and sensor.

Figure 3:
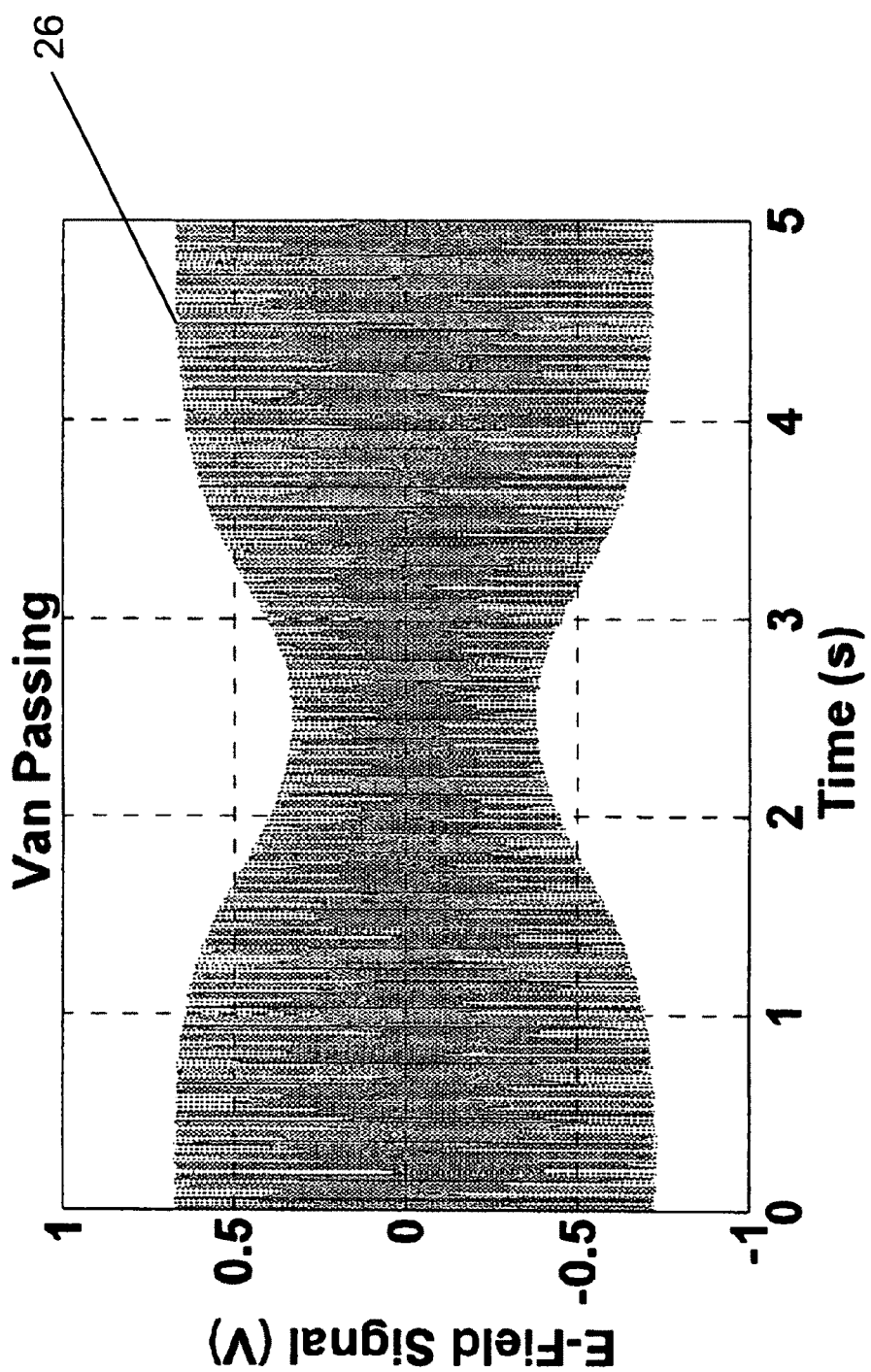
FIG. 3 is plot of a signal generated by the AC electric field sensor from FIG. 2 with an anomaly caused by a van passing through the ambient AC electric field generated by the AC power line.

FIG. 3 is a plot of a voltage signal 26 generated by sensor 18 when vehicle 24 passes through field 22. As shown in the figure, the amplitude of signal 26 decreases as vehicle 24 approaches sensor 18 and increases as vehicle 24 moves away from sensor 18. The decrease in amplitude is due to the concentration of field 22 away from sensor 18 and toward vehicle 24.

Figure 4:
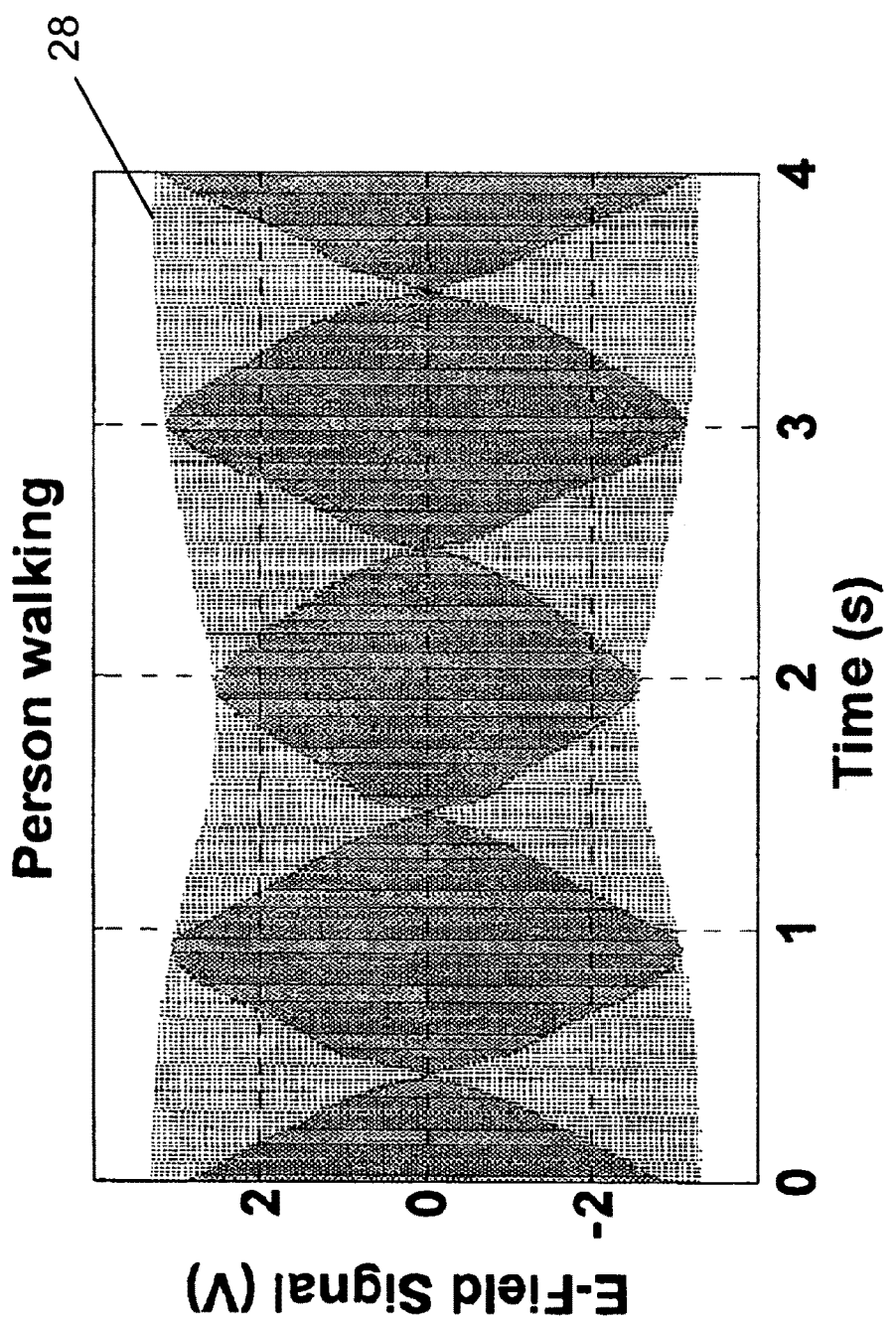
FIG. 4 is a plot of a signal generated by the AC electric field sensor from FIG. 2 with an anomaly caused by a person passing through the ambient AC electric field generated by the AC power line.

FIG. 4 is a plot of a voltage signal 28 generated by sensor 18 when a person (not shown) walks through field 22. Like signal 26, the amplitude of signal 28 decreases as the person approaches sensor 18 and increases as the person moves away from sensor 18. Note that the decrease in amplitude of signal 28 is not as pronounced as the decrease in amplitude of signal 26.

Figure 5:
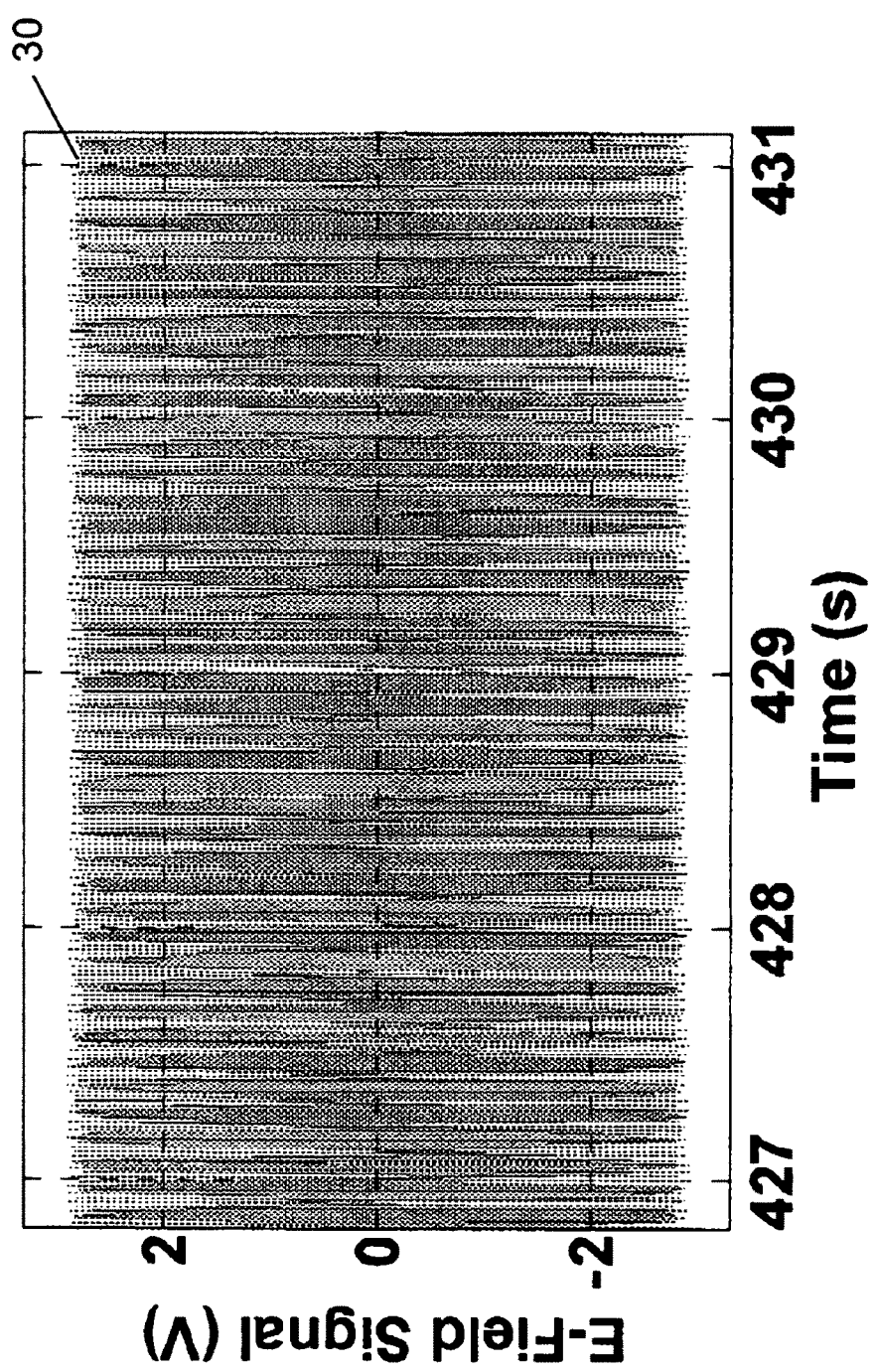
FIG. 5 is a plot of a signal generated by the AC electric field sensor from FIG. 2 where an anomaly caused by a flat bed truck passing through the ambient AC electric field generated by the AC power line is not observed in the signal.

The position of sensor 18 relative to power line 16 and the size, shape, and position of the object, as well as the type of object, passing through field 22 determines the amount of fluctuation in amplitude that will occur in the signals generated by sensor 18. Thus, in some cases, the fluctuations in the amplitude of a signal generated by sensor 18 will not be readily observable. This is illustrated by FIG. 5, which shows a voltage signal 30 generated by sensor 18 when a flatbed truck (not shown) passes through field 22. As shown in this figure, there is no perceptible change in the amplitude of signal 30 as the truck passes through field 22.

Signals 26 and 28 shown in FIGS. 3 and 4 above resemble amplitude modulated (AM) signals having a 60-Hertz (Hz) carrier signal. By demodulating these signals, baseband target signatures (also referred to as target signatures or simply demodulated signals) representative of the anomalies caused by vehicle 24 and the person passing through field 22 can be recovered. The object signature strength is dependant on the strength of field 22, and the percent modulation, which, in turn, is a complex function of size and shape of the object passing through field 22, and the geometry of sensor 18, the object 24, and the power line area.

It should be noted that modulating the signal of interest and performing detection of that signal in the extremely low frequency band, e.g., 60 Hz, eliminates some of the problems associated with 1/f noise present in prior art methods of detecting anomalies in the ultra low frequency band used with ambient DC fields.

Figure 6:
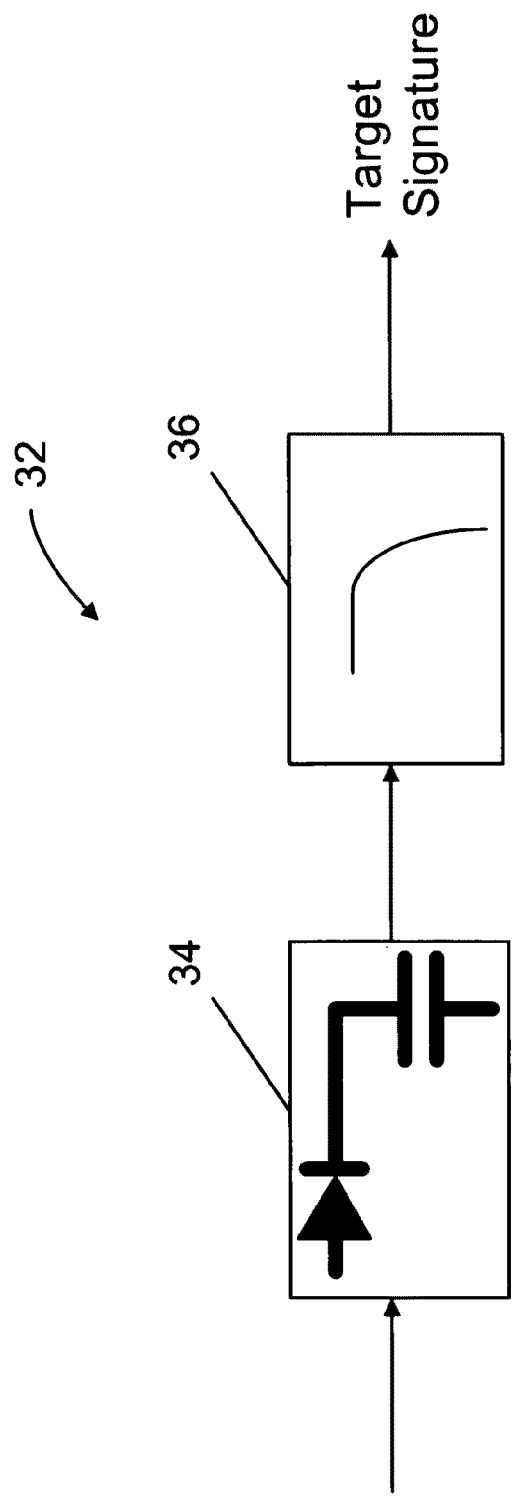
FIG. 6 is a block diagram showing an embodiment of an amplitude demodulation circuit that can be used to process signals generated by the AC electric field sensor from FIG. 2 so that anomalies in the ambient AC electric field can be observed.

In some cases, when the passing of an object through field 22 results in extremely large variations in signal amplitude, a simple AM demodulation circuit 32 (see FIG. 6) can be used to recover the desired object signature from the power line electric field data. As shown in FIG. 6, circuit 32 includes an envelope detector 34 and a low pass filter 36. Simple AM demodulation circuits like circuit 32 are well known in the art and any one of these circuits may be used with the method described in this application.

Figure 7:
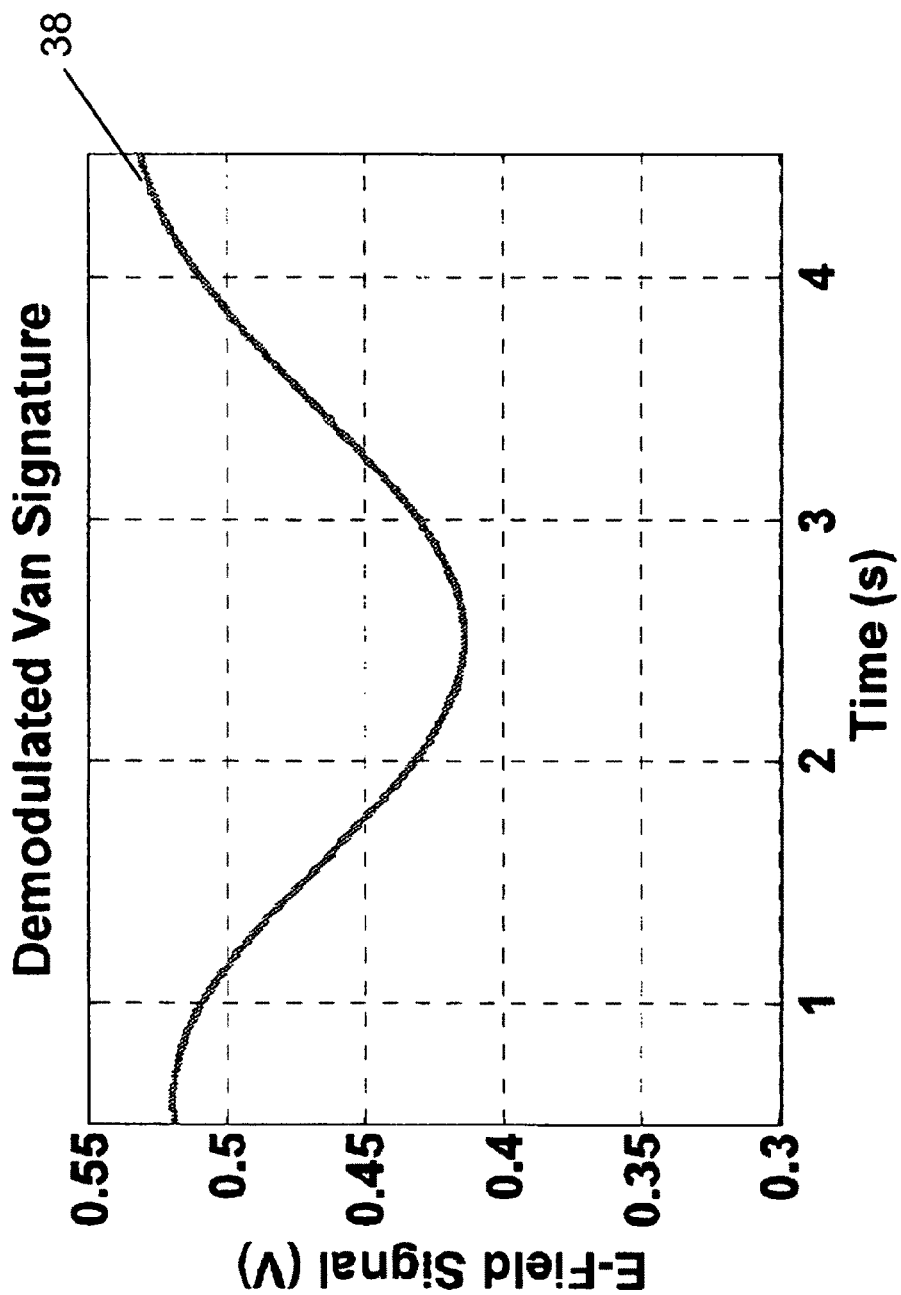
FIG. 7 is a plot of a demodulated signal showing the anomaly caused by the van passing through the ambient AC electric field in FIG. 3.

FIG. 7 shows a demodulated signal 38 (or object signature 38) that is obtained when modulated signal 26 from FIG. 3 is passed through circuit 32. As shown in this figure, the anomaly (decrease in amplitude) caused by the passing of vehicle 24 through field 22 is readily apparent.

Figure 8:
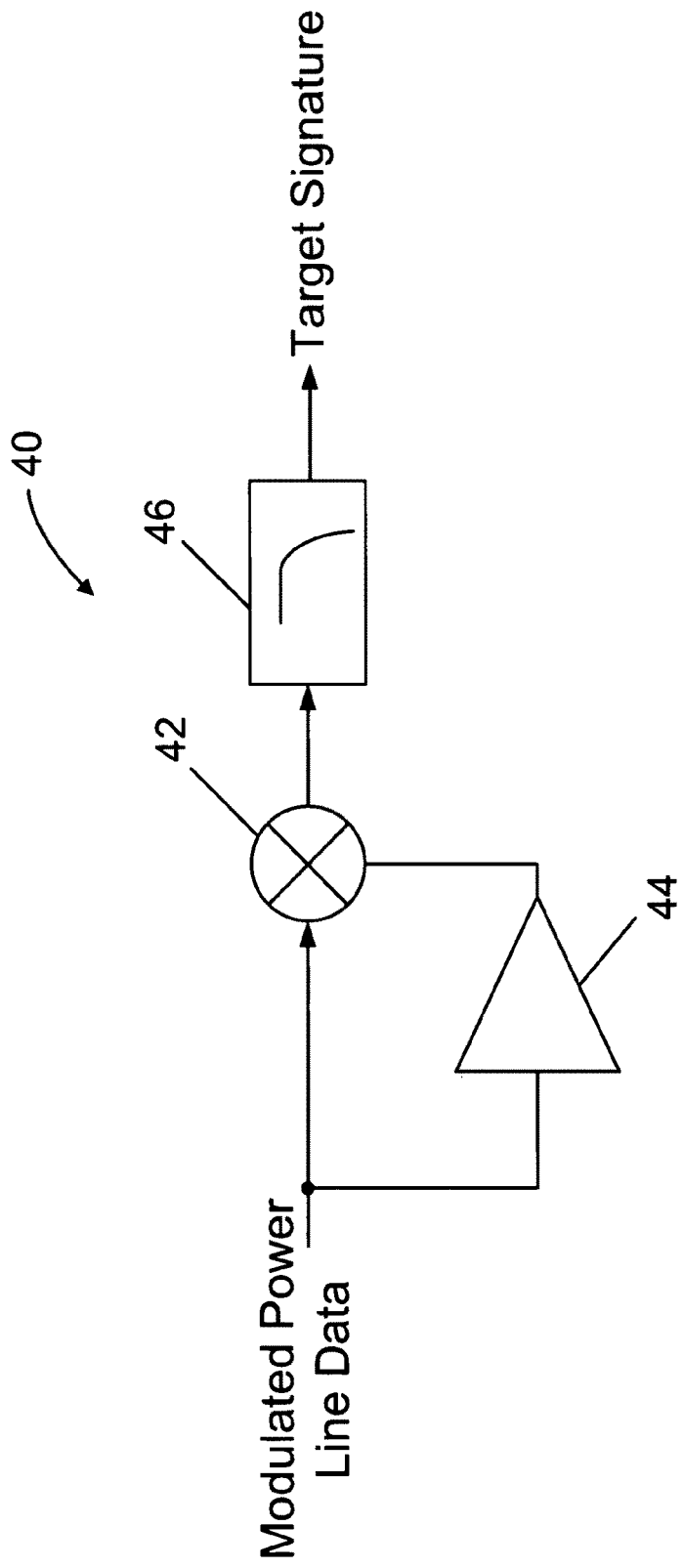
FIG. 8 is a block diagram showing an embodiment of a synchronous demodulation circuit that can be used to process signals generated by the AC electric field sensor from FIG. 2 so that anomalies in the ambient AC electric field can be observed.

In other cases, particularly where the passing of an object through field 22 does not result in extremely large variations in signal amplitude, it may not be possible to use a simple AM demodulation circuit like circuit 32 to obtain a desired object signature. In this type of situation, a synchronous demodulation (SDM) circuit 40 (see FIG. 8) may be used to obtain the desired object signature. This type of circuit may be effectively used to recover object signatures from "noisy" power line data having low signal-to-noise ratios and/or low signal-to-clutter ratios.

Circuit 40 includes a mixer 42, a high gain clipper amplifier 44, and a low pass filter 46. The raw signal generated by sensor 18 is fed to both mixer 42 and amplifier 44, which generates a local oscillator signal (not shown) that is fed to mixer 42. By feeding the raw signal generated by sensor 18 to circuit 40 in this manner, the "carrier" frequency of the raw signal will exactly match the local oscillator and slight variations in power line frequency will be compensated for automatically. Amplifier 44 can be adjusted to remove all of the modulation from the incoming raw signal in order to improve the performance of circuit 40. Synchronous demodulation circuits are well known in the art and any one of these circuits may be used with the method described in this invention.

Figures 9, 10:
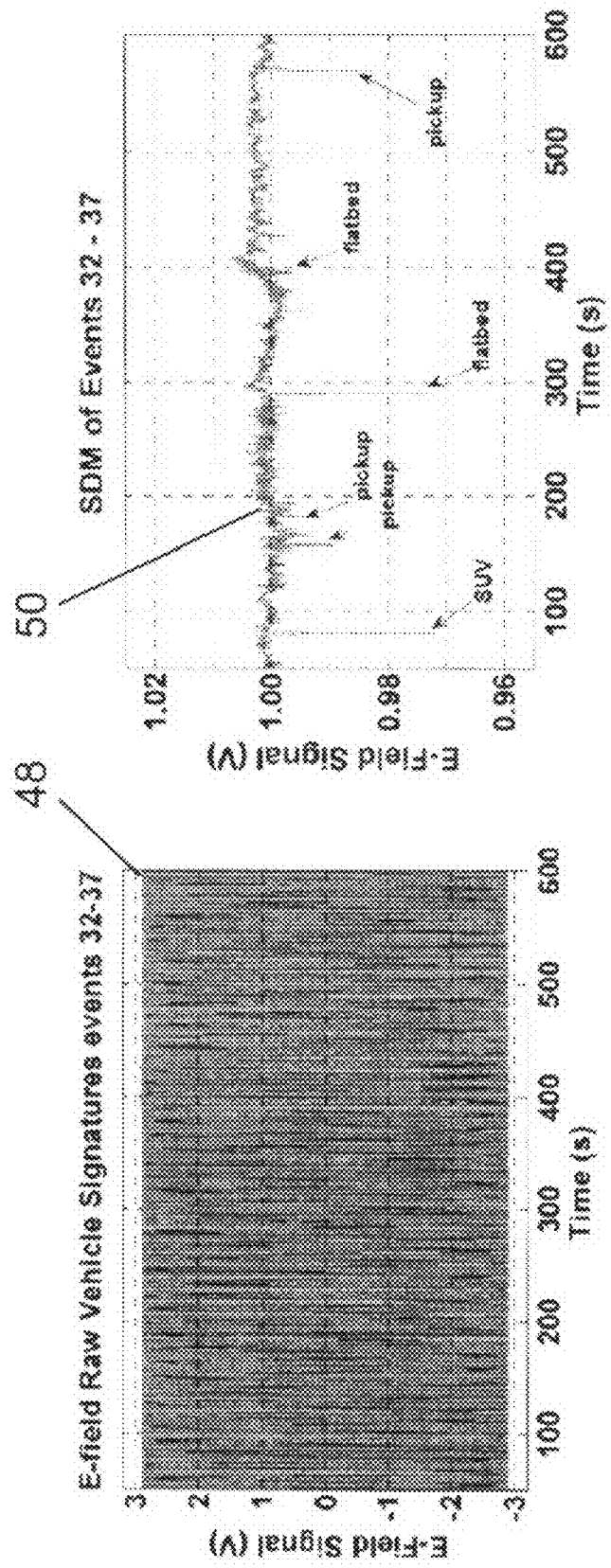
FIG. 9 is a plot of a signal generated by the AC electric field sensor from FIG. 2 where anomalies caused by multiple vehicles passing through the ambient AC electric field generated by the AC power line are not observed in the signal.
FIG. 10 is a plot of a synchronous demodulated signal showing the anomalies caused by the multiple vehicles passing through the ambient AC electric field in FIG. 9.

FIGS. 9-12 illustrate how synchronous demodulation circuit 40 may be used to obtain the desired object signatures for objects passing through field 22. FIG. 9 shows a signal 48 generated by sensor 18 when six vehicles pass through field 22. As shown in this figure, the anomalies caused by the passing of these vehicles is not readily apparent. FIG. 10, however, shows a demodulated signal 50 that has been generated by passing signal 48 through SDM circuit 40. Signal 48 clearly shows the anomalies caused by the passing of these vehicles. The anomalies are labeled, "SUV," "pickup," "pickup," "flatbed," "flatbed," and "pickup," respectively.

Figures 11, 12:
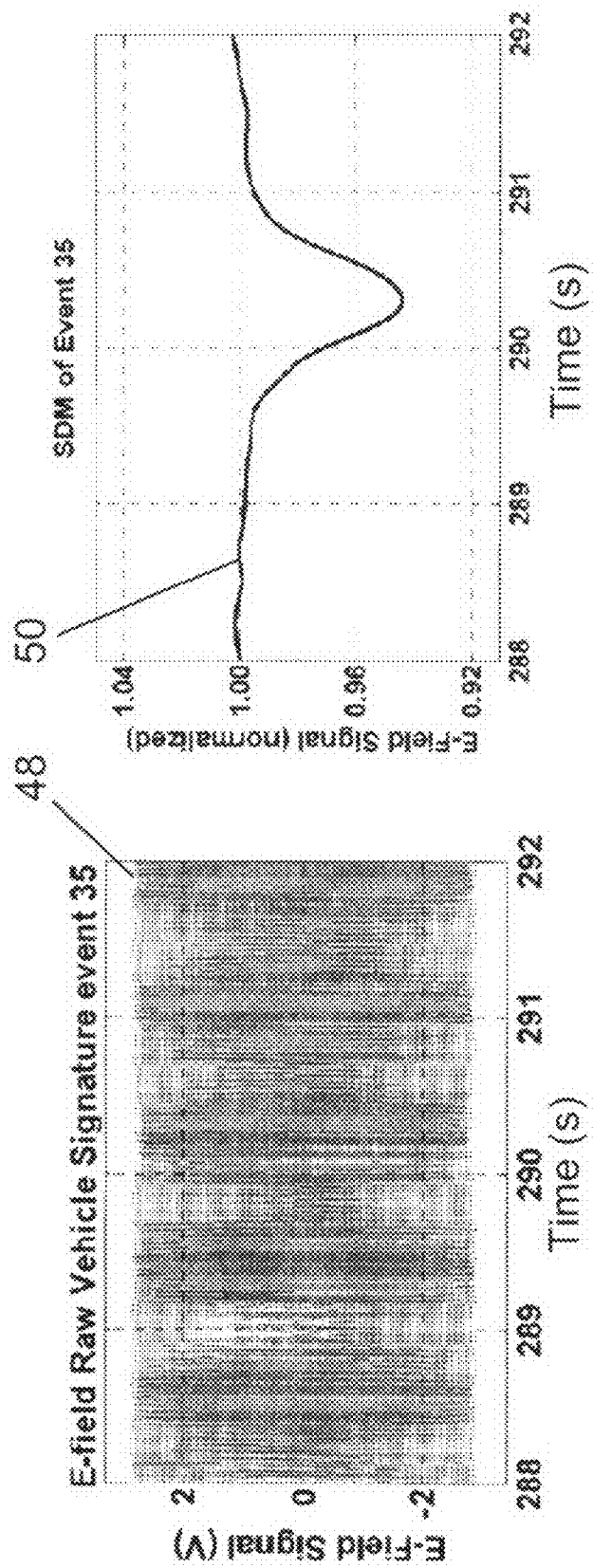
FIG. 11 is an enlarged view of the signal from FIG. 9 where the anomaly caused by a flatbed truck passing through the ambient AC electric field generated by the AC power line is not observed in the signal.
FIG. 12 is an enlarged view of the synchronous demodulated signal from FIG. 10 showing the anomaly caused by the flatbed truck passing through the ambient AC electric field in FIG. 11.

FIG. 11 is an enlarged view of FIG. 9, showing a portion of signal 48 over the time period ranging from 288 seconds to 292 seconds when a flatbed truck passed through field 22. Once again, the anomaly caused the passing of this vehicle is not readily apparent. FIG. 12 is an enlarged view of FIG. 10, showing a portion of signal 50 over the same time period. In this case, however, the anomaly caused by the passing of the flatbed truck is readily apparent.

It should be emphasized that many variations and modifications may be made to the above-described embodiments. All such modifications and variations are intended to be included herein within the scope of this disclosure and protected by the following claims.

What is claimed is:

1. A method of detecting anomalies in an ambient alternating current (AC) electric field generated by an AC power line, comprising the steps of:

placing an AC electric field sensor in an ambient AC electric field generated by an AC power line;

generating a signal representative of the ambient AC electric field received by the AC electric field sensor; and processing the signal to determine if any anomalies are present in the ambient AC electric field, said step of processing the signal includes the step of demodulating the signal with a synchronous demodulation circuit to generate a demodulated signal that includes portions representative of anomalies in the ambient AC electric field, wherein said synchronous demodulation circuit includes a mixer connected to a low pass filter and a high-gain amplifier connected to the mixer;

the signal is fed to the mixer and the high-gain amplifier; and the demodulated signal is output by the low pass filter.

2. The method of claim 1, wherein the ambient AC electric field is generated by the AC power line when the AC power line is energized but regardless of whether or not the AC power line is supplying current to a load.

3. The method of claim 1, wherein the signal is an amplitude modulated signal.

4. The method of claim 1, wherein the step of processing the signal includes the step of demodulating the signal with an amplitude demodulation circuit to generate a demodulated signal that includes portions representative of anomalies in the ambient AC electric field.

5. The method of claim 4, wherein:
the amplitude demodulation circuit includes an envelope detector connected to a low pass filter;
the signal is fed into the envelope detector; and
the demodulated signal is output by the low pass filter.

* * * * *